United States Patent
Guruprasad (10) Patent No.: US 7,701,386 B2
(45) Date of Patent: Apr. 20, 2010

(54) UNIVERSAL FREQUENCY GENERATION AND SCALING

(76) Inventor: Venkata Guruprasad, 35 Oak St., Apt. B6, Brewster, NY (US) 10509

( * ) Notice: Subject to any disclaimer, the term of this patent is extended or adjusted under 35 U.S.C. 154(b) by 113 days.

(21) Appl. No.: 12/278,704

(22) PCT Filed: Oct. 10, 2006

(86) PCT No.: PCT/US2006/039492

§ 371 (c)(1),
(2), (4) Date: Aug. 7, 2008

(87) PCT Pub. No.: WO2007/106141

PCT Pub. Date: Sep. 20, 2007

(65) Prior Publication Data

US 2009/0181619 A1    Jul. 16, 2009

(51) Int. Cl.
*G01S 13/00* (2006.01)
*G01C 3/08* (2006.01)
(52) U.S. Cl. ............... 342/200; 342/129; 356/4.01
(58) Field of Classification Search ......... 342/25 R, 342/83, 128, 129, 200; 455/196, 255, 313; 356/4.01, 5.01, 5.09, 5.15
See application file for complete search history.

(56) References Cited

U.S. PATENT DOCUMENTS

| | | | |
|---|---|---|---|
| 6,046,695 A | 4/2000 | Poehler et al. | |
| 6,307,500 B1 | 10/2001 | Cornman et al. | |
| 6,828,929 B2 | 12/2004 | Barbella et al. | |
| 6,853,456 B2 | 2/2005 | Mells | |
| 6,856,281 B2* | 2/2005 | Billington et al. | 342/174 |
| 7,180,580 B2* | 2/2007 | Guruprasad | 356/5.09 |
| 2009/0207418 A1* | 8/2009 | Kim et al. | 356/498 |
| 2009/0273505 A1* | 11/2009 | Pearson et al. | 342/81 |

* cited by examiner

*Primary Examiner*—Isam Alsomiri
(74) *Attorney, Agent, or Firm*—Ostrager Chong Flaherty & Broitman P.C.

(57) ABSTRACT

Generation of electromagnetic or other waves of any frequency, coherence, modulation, power, etc. and for scaling such waves in frequency by any factor. Generation is achieved by incorporating an available source of desired coherence, modulation and power properties at some band of frequencies and scaling to the desired frequencies. For scaling, a continuously varied frequency selection mechanism, which results in source-distance dependent frequency scaling as described in copending applications titled "Passive distance measurement using spectral phase gradients" and "Distance-dependent spectra with uniform sampling spectrometry", is combined with a means of determination, or prior knowledge, of the source distance. This distance, from the source to the frequency scaling mechanism, may be shortened with a refractive or dispersive medium, or varied for fine tuning of the frequency scale factor, and this variation may be effected via electrooptic or magnetooptic properties of the medium.

18 Claims, 5 Drawing Sheets

Universal frequency scaler

Figure 1: Universal frequency scaler

Figure 2: Universal frequency scaler with feedback control

Figure 3: Universal frequency scaler with distance-based control

Figure 4: Universal frequency scaler with refractive index control

Figure 5: Universal frequency generator

Figure 6: Universal frequency generator with feedback control

Figure 7: Universal frequency generator with distance-based control

Figure 8: Universal frequency generator with refractive index control

Figure 9: Basic frequency scaling using modulation to enhance input bandwidth

Figure 10: Output waveforms from basic frequency scaling

UNIVERSAL FREQUENCY GENERATION AND SCALING

BACKGROUND OF THE INVENTION

1. Technical Field

This invention pertains to the generation of electromagnetic or other waves of desired frequency bands or the conversion of any such waves to the desired bands. More particularly, it concerns generation of such waves, with desired coherence and modulation and at desired power levels, and conversion to or from radio frequency (RF), terahertz (THz), infrared (IR), visible, ultraviolet (UV), X-rays or even gamma ray bands without the current limitations due to molecular, atomic or subatomic properties of matter.

2. Brief Description of the Prior Art

Hitherto, there has been no general mechanism for generating electromagnetic waves at arbitrarily chosen frequency, coherence, modulation and power level, nor to transform existing waves to achieve such values. Technology becomes increasingly limited at THz and higher frequencies at which the wavelengths become comparable to those of the molecular, atomic and subatomic resonances—although the latter have been used in numerous ways to generate or modify electromagnetic waves, all such ways are limited to what material properties allow for such purposes.

For example, most of the known electromagnetic spectrum is in theory generated by incandescence, but the emitted power at visible or higher frequencies is generally small. Fluorescent lamps are more efficient, but still much too noisy, weak and bulky for high bandwidth communication purposes. Semiconductor light-emitting diodes and lasers cover much of IR and visible spectrum already, and are compact, rugged and efficient, but their spectra are generally confined to specific operating bands defined by the properties of the lasing media. The emerging method of supercontinuum generation promises better coverage, but again depends on nonlinear material properties, and is inefficient and inherently broadband, which may not be suitable for applications requiring specific frequencies. These constraints are generally more severe at THz frequencies, for which there are as yet few mechanisms known for generation in the first place. In addition, signal processing technology well established for audio and RF are difficult to apply at any of these higher frequencies.

As a result, the electromagnetic spectrum has four major divisions today in terms of current technology: RF, where we can manipulate individual waveforms and obtain coherent imaging like synthetic aperture radar (SAR); IR and visible through UV, where we get good focusing, but imaging is generally incoherent, and low noise sources (lasers) exist only for specific frequencies and bands and have low overall efficiencies; X rays and beyond where all sources are generally noisy and there is little in the way of optics; and THz, for which both sources and control of any kind are still largely experimental.

A broad method or mechanism overcoming these constraints of wave generation, or enabling translation of current technological abilities in each of these divisions to the others, is thus desirable. The difficulty, as mentioned, is that these frequencies closely correspond to molecular, atomic and subatomic resonances or bond energies, which have prevented the generation or manipulation of these waves except as permitted by specific molecular, atomic or subatomic structures, their energy levels, permitted photon transitions between these levels, and on related nonlinear properties of the media.

SUMMARY OF THE INVENTION

Accordingly, a primary object of the present invention is providing a general means for generating waves of any frequency at any combination of modulation, coherence, polarization and power characteristics, and for scaling such waves in frequency by any factor. A further object is to make such means available for terahertz (THz) and higher frequencies, possibly extending to infrared (IR), visible, ultraviolet (UV), X-ray or even gamma ray frequencies.

A related object is to overcome the existing limitations in the generation and frequency scaling due to current dependence on molecular, atomic and subatomic energy levels and transitions, or on nonlinear properties of materials. A further object is to enable accurate generation or scaling of wave frequencies.

In the present invention, these and other objects which will become apparent are achieved by innovative exploitation of novel mechanisms for scaling frequencies in proportion to distances of wave sources that are described in a first copending application, titled "Passive distance measurement using spectral phase gradients", filed 2 Jul. 2004, No. 10/884,353, and in a second copending application, titled "Distance-dependent spectra with uniform sampling spectrometry", filed 13 Feb. 2006 with priority of 13 Jul. 2005, No. 60/698,459, both being incorporated herein by reference. As these mechanisms depend on source distances, they are more directly suited for determining source distances (ranging), by comparison with the unscaled spectra, and for extracting signals from specific sources by filtering using the distance-scaled frequencies, as described in a third copending application, titled "Distance division multiplexing", filed 1 Mar. 2005 with a priority of 24 Aug. 2004, No. 11/069,152. In the present invention, these mechanisms are innovatively reused for scaling the spectrum of a local wave source already having desired coherence, modulation, power level, etc. to within the frequency scale factor.

More particularly, a technique for achieving very large distance-frequency scale factors $\alpha$ by means of a much smaller factor $\alpha'$ repetitively over a small sweep interval $\Delta t \ll 1$ s, such that $\alpha' = c^{-1} (\alpha c)^{\Delta t/1\ s}$, also described in the first copending application, is proposed in the present invention for realizing the desired target frequencies from the local source, despite its proximity as opposed to the astronomical and terrestrial communication distances previously envisaged. Additionally, the distance dependence of the frequency scaling is envisaged as a means for optional linear control of the normalized shift $z \equiv \delta\omega/\omega$, as z otherwise depends on a normalized rate of change $\alpha$ of a physical property, and therefore has an exponential sensitivity with respect to that property.

The referenced prior mechanisms involve an instantaneous frequency selection $\hat{k}$ and implement a continuous normalized rate of change $\beta$ given by $$\beta = \frac{1}{\hat{k}} \frac{d\hat{k}}{dt}, \quad (1)$$

to yield a frequency scale factor $$z = \alpha r \equiv \beta r/c, \quad (2)$$

where r is the source distance. As explained in the first copending application, frequency scaling occurs, with each received wave vector k, as a shift $$\delta\omega = \frac{\partial \phi}{\partial k}\frac{d\hat{k}}{dt} \equiv \hat{\omega}\alpha r \equiv \hat{\omega}\beta r/c, \quad (3)$$

leading to equation (2) ($z \equiv \delta\omega/\hat{\omega}$), because of the spectral gradient of phase $\partial\phi/\partial k$ necessarily present in all propagating waves. The right side of equation (3) follows from the propagation phase contribution $kr \equiv \omega r/c$ at each frequency $\omega \equiv kc$, representing the common path delay r/c from the source, as $$\frac{\partial \phi}{\partial k} \equiv \frac{\partial (kr - \omega t)}{\partial k}\bigg|_{r,k,\omega} = r. \quad (4)$$

[Equation (2) then follows upon multiplying and dividing the middle expression in equation (3) by $\hat{k}$.]

What happens is that to any subsequent detector, the instantaneous phase of the waveform arriving at the detector must appear to change not merely at the rate $\partial\phi/\partial t = -\omega$ given by the instantaneously selected frequency $\omega \equiv \hat{k}c$, but with an additional contribution $(\partial\phi/\partial k)(d\hat{k}/dt)$ because the Fourier components (sinusoids) directed to the detector are also continuously switched with their phases intact, i.e. with the phases at which they arrived at the frequency selection mechanism. The only way to avoid this contribution would be to erase the differences in the phase offsets $kr \equiv \omega r/c$ in the arriving sinusoids, since these offsets have to be proportional to frequency ($\omega$), and thus different, in order to represent the same source path delay (r/c). However, these phase offset differences are not automatically erased by any of the fundamental frequency selection mechanisms, including diffractive, refractive, resonant and even digital, as considered in first and second copending applications. This switching contribution, which must add the frequency shift $\delta\omega$ was given by equation (3) to each instantaneously selected frequency $\omega$, was thus an oversight in all of prior physics, and is therefore novel not only in the arts of ranging and signal processing, as considered in the copending applications, but also in wave generation and frequency scaling.

In the present invention, for the purpose of generating electromagnetic or other waves with the desired coherence, modulation, power or polarization characteristics, a source already possessing these properties to within a frequency scale factor, is combined with a continuously variable frequency selection mechanism as described in the first or second copending applications.

In practice, this means a relatively short distance r, of 1 m or less, between the included source and the scaling mechanism. A normalized shift of z=-10 at r=0.1 m, to implement a device of close to this length, would require $\alpha = 100$ m$^{-1}$ or $\beta = 3 \times 10^{10}$ s$^{-1}$. With repetitive sweeping with sweep intervals of $\Delta t = 100$ μs, representing a sweep frequency of 10 kHz, this enormous can be achieved with a sweep change factor of $\Delta \equiv (\beta \times 1\ s)^{10^{-4}} = 0.0024154$. This is well within the magnetostrictive dynamic range of the "smart material" Terfenol-D, hence a grating based on this material might be usable as a variable diffraction grating to achieve the frequency scaling in accordance with the first copending application. At optical frequencies, shorter sweep intervals, say 10 μs, could be used, reducing the sweep change to $\Delta = (\beta \times 1\ s)^{10^{-5}} = 0.00024127$, which would allow use of even the weaker magnetostriction of soft iron. Other material properties, such as variable refractive index due to electrooptic or magnetooptic effects, generally possess similar dynamic ranges and could be alternatively utilized as means for similarly exploiting the spectral gradient of phase in accordance with the first or second copending applications, particularly if the polarization requirements permit the use of these effects.

The present invention includes innovative if opportunistic use of the source distance dependence as an additional optional means for controlling the scale factor. This is useful, as mentioned, because the scale factor has an exponential dependence on the repetitive change and therefore becomes sensitive to small variations in the latter. For example, $\alpha=10$ m$^{-1}$ or $\beta=3\times10^9$ s$^{-1}$, i.e. frequency doubling only at 1 m, would result from a repetitive change of 0.0021846, and $\alpha=1000$ m$^{-1}$ or $\beta=3\times10^9$ s$^{-1}$ (doubling at 1 cm), would result from a repetitive change of 0.0026462 both variations being less than 10% of the required value for $\alpha=100$ m$^{-1}$. A feedback control system would be generally required in practice to compensate for drift, but a linear control mechanism would be preferable for tuning and calibration, and is generally provided by the distance between the local source and the frequency scaling mechanism, as will become clear from the Detailed Description.

For the purpose of scaling waves already having desired coherence, modulation, power or polarization properties at a first band of frequencies, to a desired second band of frequencies, the present invention requires knowledge or determination of the distance r to the source of these waves in order to set the right value for distance-frequency scale factor $\alpha$.

The source distance r may be known a priori in some scenarios. For example, the present invention may be used to observe the sun's UV emissions more conveniently by scaling down to visible wavelengths. Likewise, in communication technology, it would be occasionally convenient to transform the signals from a known base station to a frequency band more convenient for filtering, but without superheterodyning, i.e. without involving a local oscillator.

In such cases, $\alpha$ may be either computed or manually set to the right value using a tuning mechanism. This differs from the prior applications in that the frequency scaling is advocated for the object of scaling itself, rather than for determining r or for isolating the signal waves from a desired source from similar waves from other sources.

When the source distance r is not known, it may be separately determined using any among a number of ways including the distance-dependent scaling methods of the first or second copending applications, and the determined value of r then applied to the computation or manual setting of $\alpha$ as just described. A simpler alternative might be to use a feedback control system that starts with a small $|\alpha|$, say $|\alpha| \approx 0$, and raises $|\alpha|$ until a frequency scaled signal adequately matching the original (unscaled) waves is detected at the desired frequencies. Broad matching criteria should suffice since a frequency scaling application presumes unscaled source signal with some identifiable characteristics—the distance-dependent frequency scaling mechanisms of the first and second copending applications as such require nonzero linespreads, precluding pure tone carriers and pure tone amplitude modulation, which would not be so distinguishable.

Numerous variations of the invention, both by itself and in combination with other technologies, are envisaged and intended within its scope. For example, in an exemplary device for generating IR, optical or UV frequencies, a medium of high refractive index may be incorporated in the electromagnetic path between the local source and the frequency scaling means so as permit operation with smaller r or smaller $\alpha$ for the same normalized shift z. In the presence of a refractive medium, the path contribution to the wave phase increases to $\delta\phi = \eta kr$, and the result of spectral scanning becomes $$\delta\omega \equiv \frac{d\phi}{dt}\bigg|_r = \frac{d\hat{k}}{dt}\frac{\partial}{\partial k}(\eta kr) = \hat{\omega}\alpha\eta r. \quad (5)$$

Thus, with a medium of $\eta > 1$, the distance r between the local source and the scaling means could be reduced by the same factor $\eta$, allowing a more compact realization, or $\alpha$ reduced by $\eta$. While the latter may have occasional uses, the reduction of r would be more generally useful because a large effective r allows finer control over z. A practical strategy would be to incorporate such medium for a large portion of the physical path, leaving a small portion of the path around the source to air or vacuum, to facilitate controlled movement of the source for the fine tuning of z. This strategy especially permits use of solid media of large $\eta$, whereas a fluid medium of comparable $\eta$, although allowing embedded source motion, would be relatively bulky and unwieldy. Multiple loops of transmission lines, waveguides or optical fibres may be used instead so as to pack a substantial physical r within a small volume.

An obvious variation on the use of a refractive medium is to incorporate a medium exhibiting negative refractive index ($\eta < 1$) at the source frequencies. This would achieve an effectively shorter optical path length, which would be useful in cases where the source needs to be physically farther than allowed for by the frequency scaling mechanism and its operating $\alpha$. Such a situation may occur, for instance, with high power sources requiring additional space for power supply and cooling. Even the frequency scaling mechanism may have to be bulkier and need to be cooled in such cases.

A related variation is to use a normally dispersive medium, i.e. whose refractive index increases linearly with frequency over the local source spectrum, so as to skew the spectral envelope of the phase offsets faster than propagation in free space, thereby yielding a larger scale factor. Equation (5) becomes $$\delta\omega \equiv \frac{d\hat{k}}{dt}\frac{\partial}{\partial k}(\eta kr) = \hat{\omega}\alpha\left(kr\frac{\partial\eta}{\partial k} + \eta r\right) = \hat{\omega}\alpha\eta r\left(1 + \frac{k}{\eta}\frac{\partial\eta}{\partial k}\right), \quad (6)$$

revealing a clear advantage to using a dispersive medium with $\partial\eta/\partial k > 0$. While $\eta$, is invariably a small integer, large values of $(k\partial\eta/\partial k)$ can be achieved for specific narrow frequency bands by suitable choice of material. Such highly dispersive bands generally occur around molecular or atomic resonances. Again, it would be obvious to those skilled in the related arts that a medium exhibiting anomalous dispersion, i.e. $\partial\eta/\partial k < 0$, could be analogously used instead, say to physically accommodate a high power source and a bulkier frequency scaling mechanism.

In these variations, a "smart material", whose refractive index $\eta$, or index profile $\partial\eta/\partial k$ can be varied dynamically say using electrooptic or magnetooptic properties, may be used instead, as a possibly more convenient, "no moving parts" means for effectively varying r for tuning z, and could be clearly combined with feedback control of $\alpha$ for accurate tuning over a large range of z. A more mundane alternative, which may be preferable for precision tools where bulk is of less importance, would be a servo-driven mechanical screw on which either or both of the source and the frequency scaling mechanism are mounted, so that r can be adjusted by hand or by a servo motor.

A general, but minor, issue with the techniques of the first and second copending applications is that the distance-dependent shifts are inseparable from the chirping, i.e. the continuous variation of frequency represented by $d\hat{k}/dt = \beta\hat{k}$, which means that the output waveforms are also chirps and not sinusoidal. A related problem is that not only is the output discontinuous between successive sweeps, but includes the desired frequency only once per sweep. If the sweep were large, the output would have to be accurately sampled once per sweep, and the samples somehow combined to produce the frequency-scaled sinusoidal waveform. For example, successive samples could be combined by a resonator or a resistance-reactance combination that integrates the samples to produce a continuous output waveform, or by a monochromator or by a spectrum analyzer and filter combination at optical and shorter wavelengths, for the same purpose. Samples could be similarly combined from multiple sweeps from multiple realizations of the sweep mechanism or a single sweep mechanism with multiple outputs, like the diffractive and DSP implementations described in the first and second copending applications. Fortunately, the sweep change factor $\Delta$ also defines the maximum variation of frequency in the output, and would be kept below 1% for implementational reasons, as explained, so the additional steps of sampling and combining generally would not be required. Simple resonators or monochromators may thus suffice in most applications, and may be eliminated in others. Moreover, a small $\Delta$ allows faster sweep repetition and smoother output.

Yet another basic difficulty lies in the dependence on adjacent frequencies in the received waves, which are successively selected and combined by the varying $\hat{k}$. As remarked in the first copending application, a nonzero bandwidth is fundamentally guaranteed for all real signals by the fact that a perfect sinusoid, by definition, cannot have a beginning or an end, and hence cannot transport any information or energy. Additionally, the principle of Green's functions holds that every source is equivalent to a distribution of point sources. While the traditional use of Green's functions in Fresnel-Kirchhoff diffraction theory is in terms of continuous point source distributions[1], the principle itself does not differentiate between time and space coordinates, meaning that point impulse distributions should be considered as a more general picture inclusive of real sources with finite lifetimes. Not only does an impulse have an infinite continuous spectrum, but all of its spectral components start at the impulse with the same phase, crucially ensuring that the spectral phase gradients $\partial\phi/\partial k$ remain consistent with the actual source impulse location at least over a differential neighbourhood of $\omega = kc$. These notions are assuring in the cosmological context as described in the first copending application, where the applicable $\beta$ is very small, given by $\beta = H_0 \sim 10^{-18}$ s$^{-1}$. In an application of the present invention, if the source has bandwidth less than $\Delta$, the frequency-scaled output would be weak. A trick included in the present invention for such a source is to provide an artificial bandwidth by modulating it with say a pseudo-random sequence, which can be subsequently subtracted from the frequency scaled output, if desired, say by reverse modulation with the same sequence.

[1] See, for instance, the classic text, "Principles of Optics" by M. Born and E. Wolf, Pergamon, 1959.

Numerous other objects, features, variations and advantages of the present invention will be apparent when the detailed description of the preferred embodiment is considered in conjunction with the drawings, which should be construed in an illustrative and not limiting sense.

DETAILED DESCRIPTION OF THE PREFERRED EMBODIMENT

Figure 1:
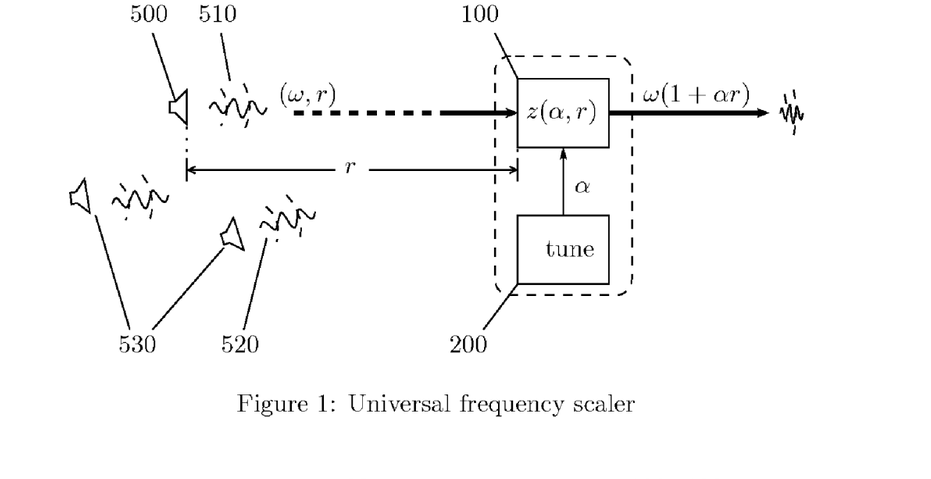
FIG. 1 is a block diagram of an exemplary device illustrating the basic structure of the present invention for the object of scaling electromagnetic or other waves in frequency, utilizing a distance-dependent frequency scaling mechanism.

The preferred embodiment of the present invention fundamentally comprises, for the principal object of scaling electromagnetic or other waves, a distance-dependent frequency scaling mechanism [100] as described in the first and second copending applications, involving an instantaneous frequency selection $\tilde{k}$ and implementing a continuous normalized rate of change of selection $\beta$ as defined in equation (1), in combination with a tuning means [200] for setting $\alpha \equiv \beta/c$, as shown in FIG. 1.

Figure 2:
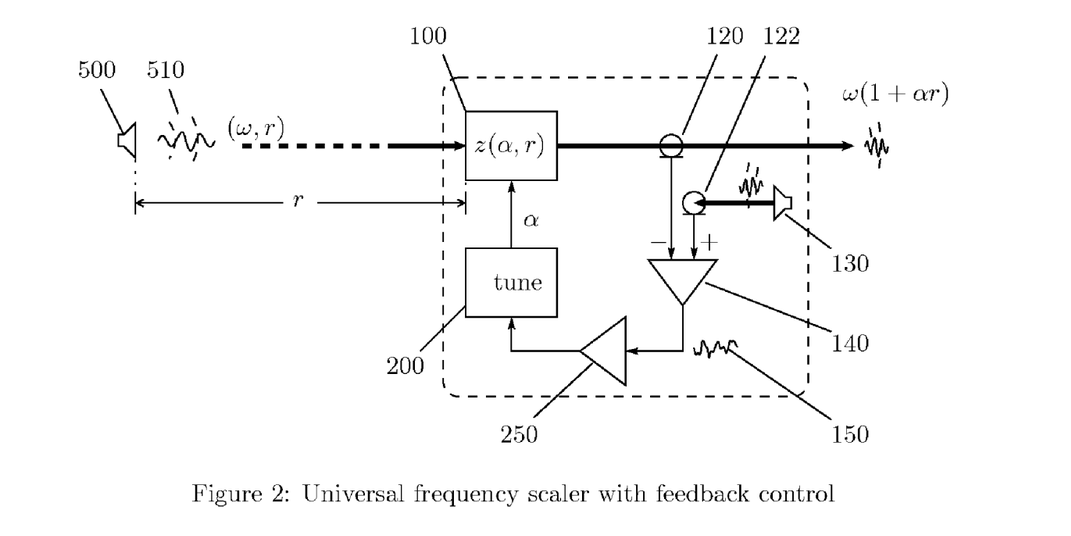
FIG. 2 illustrates the exemplary device of FIG. 1 augmented with feedback control of the scaling factor.

It differs from the copending applications in that the object is the frequency scaling itself, rather than determination of the distance r to a wave source [500] or use of the information of the dependence of the normalized shift z on r for filtering or isolating the wave signal [510] from that source from similar waves [520], possibly overlapping in frequency, time slot, spread-spectrum coding, etc., from other sources [530], as described in the prior applications. As illustrated in FIG. 2, feedback control may be added using a sensor [120] to measure the scaled frequencies, a frequency reference source [130], a second sensor [122] to measure the output of the frequency reference source [130], a comparator [140] to compare the outputs of both sensors [120] and [122] and to provide a feedback signal [150], in proportion to or otherwise indicative of the difference. The feedback signal [150] is not required to be proportional: it would be often sufficient to generate a positive or negative voltage of fixed magnitude indicating whether the scaled frequencies are too high or too low relative to the frequency reference [130] by more than a threshold magnitude. Likewise, the second sensor [122] may not be needed if the frequency reference source [130] outputs an electrical signal directly, like a crystal oscillator for operation in an RF range. The feedback signal [150] may need to be conditioned by a first signal conditioner [250] before being fed back to the tuning means [200] to correct the normalized shift z.

Figure 3:
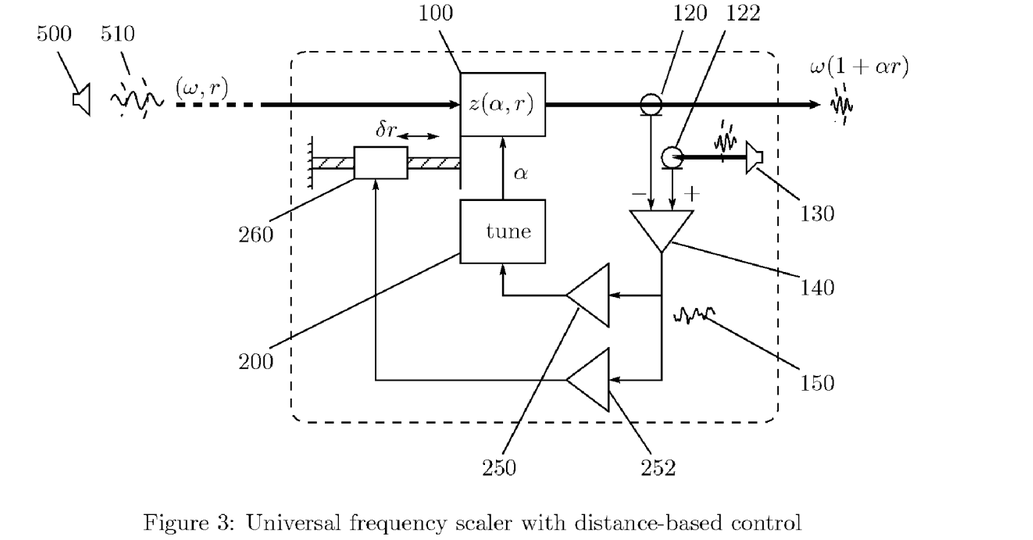
FIG. 3 illustrates the exemplary device of FIG. 1 augmented with feedback control of the physical distance from a wave source to achieve fine control over the scaling factor.
Figure 4:
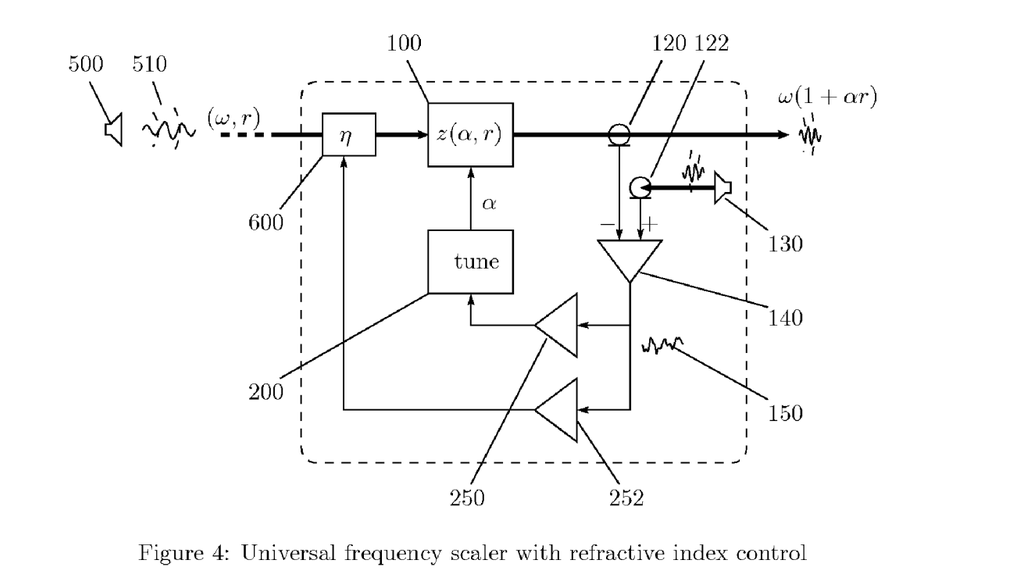
FIG. 4 illustrates the exemplary device of FIG. 1 augmented with a medium of variable refractive index to achieve fine control over the scaling factor.

While the dependence of z on r is not immediately relevant to the object of frequency scaling, it has an optional innovative use as a means of fine control of the normalized shift z. The innovative, opportunistic use of the r-dependence lies in feeding the output of the comparator [140] via a second conditioner [252] to change the effective source distance r, either by increasing the actual physical distance between the wave source [500] and the distance-dependent frequency scaling mechanism [100] using a distance adjustment means [260] or by varying the refractive index $\eta$ of an electro-optic or magneto-optic device [600] located between the wave source [500] and the distance-dependent frequency scaling mechanism [100]. In the latter case, since the electro-optic or magneto-optic device [600] will only occupy a small portion of the overall distance r, and refractive indices are ordinarily small, very precise control would be realized over the normalized shift z. These three methods of control, i.e. of $\alpha$, r or $\eta$, may be incorporated and used individually, or combined in various ways, in a given instrument.

A frequency scaler as just described can be combined with a suitable wave source to obtain a generator of waves of any desired scaled frequencies. More specifically, a tunable scaler can be used with a source possessing a fixed frequency or a limited operating range of frequencies to realize a source able to generate waves over a much larger range of frequencies by scaling. Modulation, polarization, power and other properties of the combined source can be preserved provided these properties are not substantially altered by the frequency scaling mechanism and its associated control systems if any.

Figure 5:
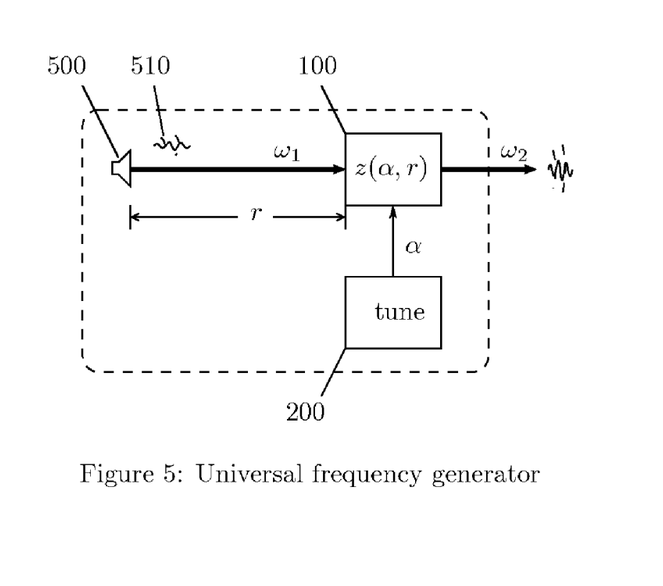
FIG. 5 is a block diagram of an exemplary device illustrating the basic structure of the present invention for the object of generating electromagnetic or other waves at a desired set of frequencies with some desired combination of modulation, coherence, polarization, power and other properties, utilizing a distance-dependent frequency scaling mechanism.
Figure 6:
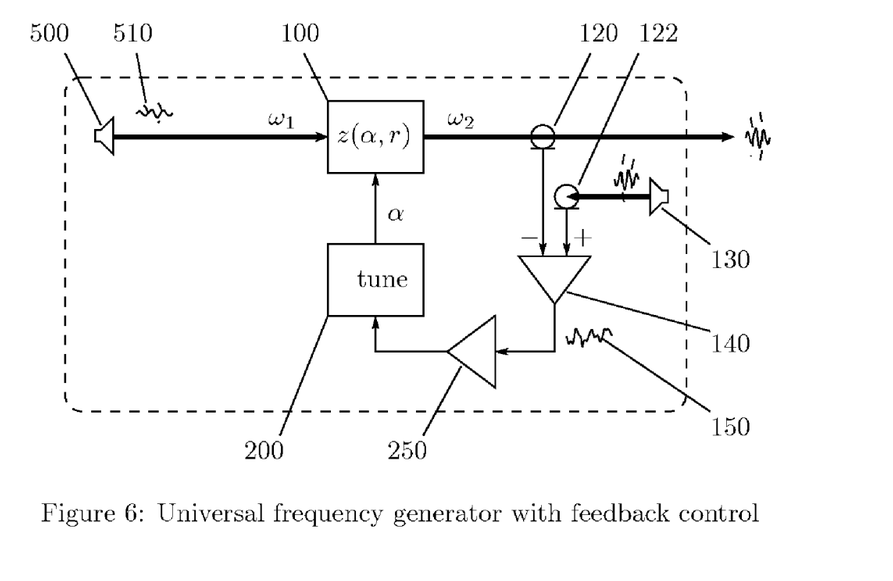
FIG. 6 illustrates the exemplary device of FIG. 5 augmented with feedback control of the scaling factor.
Figure 7:
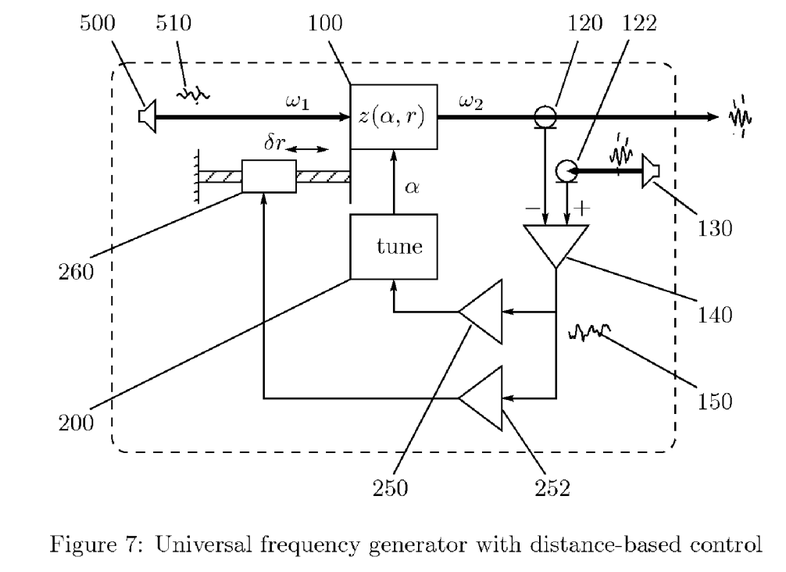
FIG. 7 illustrates the exemplary device of FIG. 5 augmented with feedback control of the physical distance from an included wave source to achieve fine control over the scaling factor.
Figure 8:
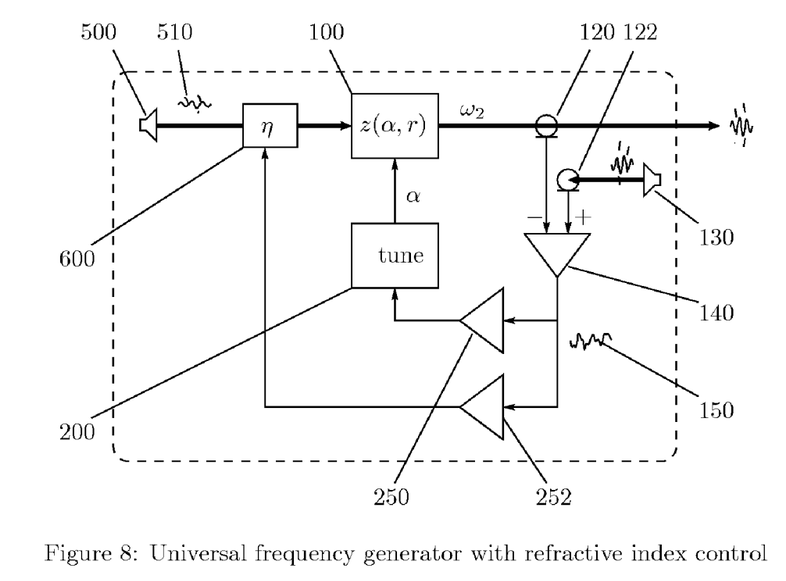
FIG. 8 illustrates the exemplary device of FIG. 5 augmented with a medium of variable refractive index to achieve fine control over the scaling factor.

FIG. 5 illustrates this inventive combination of a frequency scaling mechanism [100] as described in the prior applications, with a source [500] emitting signal waves [510] having modulation, polarization, power and other characteristics as may be desired, but at a first band of frequencies around $\omega_1$, so as to produce waves of similar properties at a second, desired band of frequencies around $\omega_2$ by scaling the signal waves [510] using a normalized shift $z=\omega_2/\omega_1-1$. FIG. 6 shows the corresponding feedback control of the scaling factor $\alpha$. FIG. 7 illustrates the corresponding distance-based control of the normalized frequency shift z by varying the physical distance r of the wave source [500] from the frequency scaling mechanism [100], analogous to the inventive device of FIG. 3. FIG. 8 shows the corresponding distance-based control by varying the effective path length r of the wave source [500] from the frequency scaling mechanism [100], using an electro-optic or magneto-optic device [600] just like in the inventive scaler of FIG. 4. Both FIG. 7 and FIG. 8 also show simultaneous control of $\alpha$, as do FIGS. 3 and 4, purely to illustrate how the three methods of control may be combined in a given receiver implementing the present invention.

Figure 9:
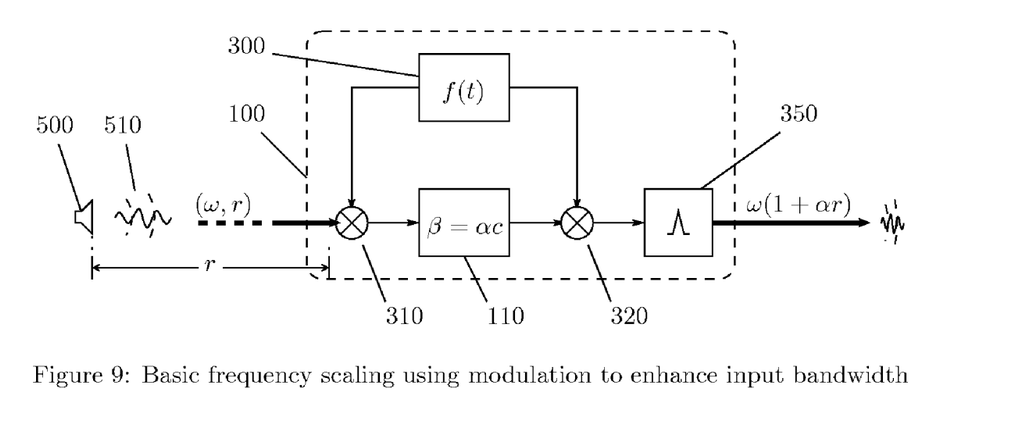
FIG. 9 is a block diagram of an improved distance-dependent frequency scaler for possible use in the exemplary devices of FIG. 1 and FIG. 5

Finally, the source bandwidth, necessary for the frequency scaling as explained in the Summary and the referenced copending applications, could turn out to be inadequate in some cases and may be enhanced by modulation, as shown in FIG. 9, with a known signal f(t), such as a pseudo-random sequence from another source [300], using a multiplier or other modulation means [310]. The modulated waveform is then given as input, in place of the original waves [510], to the actual frequency scaling mechanism [110], which applies a changing instantaneous frequency selection at the change rate of $\beta \equiv \alpha c$ to repetitively sweep the spectrum of the input wave signal [510], as treated in the first and second copending applications, to produce the desired frequency scaling as explained in the Summary. The known signal f(t)'s content may be then subtracted from the output of the actual frequency scaling mechanism [110] by a second multiplier or other modulation-subtractor means [320], which would generally need access to f(t) for reference.

This subsequent subtraction of the modulating known signal may be unnecessary in some applications, e.g. where the need is simply for illumination around the desired scaled frequency. In such cases, the output of the actual frequency scaling mechanism [110] can be used directly and the second multiplier or other modulation-subtraction means [320] can be eliminated. (An alternative combination of the actual frequency scaling mechanism [110] with the second multiplier or other modulation-subtractor means [320] would be merely equivalent to a modulation of the output of the general frequency scaling mechanism [100] of FIG. 1.) This combination of a known signal source [300], a first multiplier or other modulation means [310] and an optional second multiplier or other modulation-subtractor means [320] along with an actual frequency scaling mechanism [110] corresponds to, and would replace, the distance-dependent frequency scaling mechanism [100] for frequency scaling sources of insufficient bandwidth.

Figure 10:
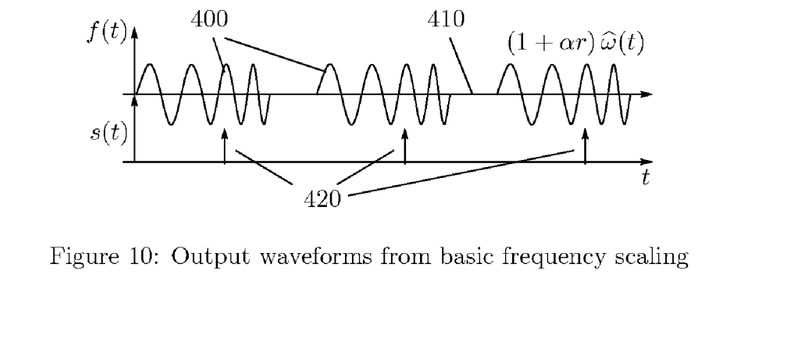
FIG. 10 is a graph illustrating the typical output waveform of a basic distance-dependent frequency scaler that would be used in the exemplary devices of FIG. 1 and FIG. 5.

FIG. 9 further includes an optional post-filter [350] for extracting the desired scaled frequency from the output of the actual frequency scaling mechanism [110] and the optional second multiplier or other modulation-subtractor means [320], as this output waveform will be inherently a chirp and not sinusoidal, as remarked in the Summary. More specifically, since the actual distance-dependent frequency scaling mechanism [110] functions by sweeping the spectrum of the input wave signal [510], its instantaneous frequency selection $\hat{\omega}(t)$ necessarily comprises a succession of chirps each corresponding to a single sweep, likely separated by blanking intervals. The output waveform (FIG. 10) would ideally follow $\hat{\omega}(t)$ except for the frequency scale factor $(1+z) \equiv (1+\alpha r)$, with a similar succession of chirps [400] and blanking intervals [410] in between. FIG. 10 represents only the ideal case of a point impulse source because with most sources, the contributions within each chirp will not have equal amplitude, so in general, the chirps will not exhibit a uniform amplitude as shown.

However, as explained in the Summary, the total variation $\Delta$ of the instantaneous frequency during each chirp is as such likely to be small for reasons having to do with the implementation of the distance-dependent frequency scaling mechanism [100] or the actual frequency scaling mechanism [110], and that even otherwise, it is desirable to keep $\Delta$ small to allow fast repetition of the sweeps. So the frequency and amplitude variations within a chirp should not generally matter.

It would be obvious to those skilled in the related arts that it would be further desirable to minimize the blanking intervals [410], and further that a fairly pure sinsoidal signal of the desired scaled frequency can be readily extracted, where particularly desired, in one of several ways of implementing the post-filter [350], including passing the waveform through a band-pass filter, a physical resonator or a resonant circuit tuned to the desired scaled frequency;

sampling the chirps at precise sampling instants [420] when the instantaneous frequency just matches the desired scaled frequency and combining the resulting succession of sample energies (or voltages or currents or electromagnetic field strengths or acoustic displacements or pressures) to obtain the output (sinusoidal) waveform;

in diffractive implementations of the actual distance-dependent frequency scaling mechanism [110] as described in the first and second copending applications, sampling as above at two or more angles of diffraction and optionally combining these sample streams to obtain a stronger output signal;

and combining two or more actual frequency scaling mechanisms to sweep the input wave signal [510] in parallel, synchronously, or at the same sweep rate but with overlapping sweeps, or at different sweep rates altogether, to obtain a stronger output signal.

The filtering approach would be generally simpler and yield a stronger output signal combining the total energy of each chirp, whereas sampling will likely diminish the output power. In either case, an almost pure sinusoidal signal of the desired scaled frequency would result that closely follows the variation over time of the amplitude, phase and other properties of the original input wave signal [510], subject only to some distortion of these properties by the band-pass filtering or inaccuracy in the synthesis.

Although the invention has been described above with reference to the preferred embodiment, it will be appreciated by one of ordinary skill in the arts of physics, electronics and communication technologies that numerous modifications and variations are possible in the light of the above disclosure. For example, the inventive method could be conceivably applied to sound and to communication under water. All the component functions other than the distance-dependent frequency scaling mechanisms ([100] and [110]) are known in both acoustic and electromagnetic technologies, and in both analogue and digital signal processing fields, and as such, can be variously implemented by those skilled in the respective arts. Thus, for instance, the comparator [140], the conditioner [250] and the tuner [200] would be generally electrical devices connected by wires as shown in the figures, but could be implemented by analogous mechanical devices, in submarine applications or on the nanoscale. They could be also replaced by equivalent optical devices and the wiring could be replaced by optical fibres, transmission lines, radio channels or a suitable digital network. For the distance-dependent frequency scaling mechanisms ([100] and [110]), the first and second copending applications similarly identify numerous implementation strategies suited to various forms of input waves, in all three basic classes of frequency selection, viz resonant, diffractive and digital, and it would be clear to the skilled practitioner that all three approaches could be applied to electrical signals, sound, and electromagnetic waves including visible and higher frequencies. Similarly, the post-filter [350] may comprise a combination of a slit, to select the output chirps at a desired diffraction angle, a second Fourier spectrometer to spread the component frequencies of the chirps and a second slit to select one of these component frequencies, as an alternative to the time-domain approach of sampling. Further, the post-filter [350] may be applied to the output of the distance-dependent frequency scaling mechanism [100], i.e. to the equivalent actual frequency scaling mechanism [110] without the first multiplier or other modulation means [310] and known signal source [300].

All such modifications, generalizations and variations are intended within the scope and spirit of the invention as defined in the claims appended hereto.

I claim:

1. A device for scaling electromagnetic or other waves from an external source at a nonzero distance r arriving at a first band of frequencies $\omega_1$ to a second band of frequencies $\omega_2$, the device comprising a continuously variable frequency selection means, wherein the continuously variable frequency selection means is varied at a normalized rate β, in order to achieve the scaling of the frequencies of the electromagnetic or other waves, and the normalized rate β is set to a wave speed c times the ratio of the difference between the second and the first bands of frequencies to the first band of frequencies divided by the distance r between the external source and the continuously variable frequency selection means, to $c \cdot (\omega_2 - \omega_1)/(\omega_1 \cdot r)$.

2. The device of claim 1 further including a feedback control means to dynamically compare the output of the continuously variable frequency selection means with the first band of frequencies $\omega_1$, and to accordingly correct the normalized rate, thereby ensuring that the second band of frequencies $\omega_2$ results.

3. The device of claim 1 further including a modulation means before the continuously variable frequency selection means, an optional modulation-subtractor means after the continuously variable frequency selection means, and a known signal, wherein the modulation means modulates the electromagnetic or other waves with the known signal, and the optional modulation-subtractor means, if present, eliminates the known signal modulation from the electromagnetic or other waves.

4. The device of claim 1 further including a post-filter means for refining or extracting the second band of frequencies $\omega_2$, located after the continuously variable frequency selection means.

5. A device for generating electromagnetic or other waves at a first band of frequencies $\omega_1$, the device comprising an internal source producing said electromagnetic or other waves at a second band of frequencies $\omega_2$, and a continuously variable frequency selection means located at a nonzero distance r from the internal source, wherein the continuously variable frequency selection means selects a continuously changing frequency in the electromagnetic or other waves from the internal source and the frequency selection is varied at a normalized rate β set to a wave speed c times the ratio of the difference between the second and the first bands of frequencies to the first band of frequencies divided by the distance r from the internal source to the continuously variable frequency selection means, to $c \cdot (\omega_2 - \omega_1)/(\omega_1 \cdot r)$.

6. The device of claim 5 further including a feedback control means to dynamically compare the output of the continuously variable frequency selection means with the first band of frequencies $\omega_1$ and to accordingly correct the normalized rate β in order to ensure that the second band of frequencies $\omega_2$ results.

7. The device of claim 5 further including a feedback control means to dynamically compare the output of the continuously variable frequency selection means with the first band of frequencies $\omega_1$ and to accordingly vary the distance r between the internal source and the continuously variable frequency selection means so as to ensure that the second band of frequencies $\omega_2$ results.

8. The device of claim 5 further including a possibly dispersive medium of nonunity refractive index between the internal source and the continuously variable frequency selection means to shorten or adjust the distance r between the internal source and the continuously variable frequency selection means.

9. The device of claim 7 further including a possibly dispersive medium of variable refractive index between the internal source and the continuously variable frequency selection means, wherein effective variation of the distance r between the internal source and the continuously variable frequency selection means is achieved by varying the refractive index of the medium.

10. The device of claim 5 further including a modulation means before the continuously variable frequency selection means, an optional modulation-subtractor means after the continuously variable frequency selection means, and a known signal, wherein the modulation means modulates the electromagnetic or other waves with the known signal, and the optional modulation-subtractor means, if present, eliminates the known signal modulation from the electromagnetic or other waves.

11. The device of claim 5 further including a post-filter means for refining or extracting the second band of frequencies $\omega_2$, located after the continuously variable frequency selection means or after the optional modulation-subtractor means.

12. A method for generating electromagnetic or other waves or scaling electromagnetic or other waves emitted by a source, from a first band of frequencies $\omega_1$ to a second band of frequencies $\omega_2$, in a device including a continuously variable frequency selection means, the method comprising the step of continuously varying the frequency selection at a normalized rate β set to a wave speed c times the ratio of the difference between the second and the first bands of frequencies to the first band of frequencies divided by the distance r from the source to the continuously variable frequency selection means, to $c \cdot (\omega_2 - \omega_1)/(\omega_1 \cdot r)$.

13. The method of claim 12 in a device further including a feedback control means to dynamically compare the output of the continuously variable frequency selection means with the first band of frequencies $\omega_1$, the method additionally comprising the step of dynamically correcting the normalized rate in order to ensure that the second band of frequencies $\omega_2$ results.

14. The method of claim 12 in a device further including a feedback control means to dynamically compare the output of the continuously variable frequency selection means with the first band of frequencies $\omega_1$, the method additionally comprising the step of dynamically varying the distance r from the source to the continuously variable frequency selection means, in order to ensure that the second band of frequencies $\omega_2$ results.

15. The method of claim 14 in a device additionally including a possibly dispersive medium of variable refractive index between the source and the continuously variable frequency selection means, wherein the step of varying the distance r between the source and the continuously variable frequency selection means is performed in effect by varying the refractive index of the medium.

16. The method of claim 12, wherein the device further includes a possibly dispersive medium of nonunity refractive index between the source and the continuously variable frequency selection means.

17. The method of claim 12, including the additional steps of first modulating the electromagnetic or other waves with a known signal before scaling of said electromagnetic or other waves from the first band of frequencies $\omega_1$ to the second band of frequencies $\omega_2$, and optionally removing this known signal modulation from the electromagnetic or other waves after said scaling to the second band of frequencies $\omega_2$.

18. The method of claim 12, including an additional step of post-filtering the electromagnetic or other waves after said scaling to refine or extract the second band of frequencies $\omega_2$.

* * * * *